United States Patent [19]
Fujioka

[11] Patent Number: 5,346,840
[45] Date of Patent: Sep. 13, 1994

[54] METHOD OF PRODUCING HETEROJUNCTION BIPOLAR TRANSISTOR HAVING NARROW BAND GAP BASE TYPE

[75] Inventor: Hiroshi Fujioka, Tokyo, Japan

[73] Assignee: Fujitsu Limited, Kawasaki, Japan

[21] Appl. No.: 986,294

[22] Filed: Dec. 7, 1992

Related U.S. Application Data

[60] Division of Ser. No. 704,721, May 20, 1991, Pat. No. 5,198,689, which is a continuation of Ser. No. 442,828, Nov. 29, 1989, abandoned.

[30] Foreign Application Priority Data

Nov. 30, 1988 [JP] Japan .................................. 63-304503

[51] Int. Cl.$^5$ .................... H01L 21/265; H01L 29/70
[52] U.S. Cl. ........................ 437/31; 437/131; 437/192; 148/DIG. 10; 148/DIG. 72; 257/183; 257/197
[58] Field of Search ............ 437/31, 131, 192; 148/DIG. 72, DIG. 10, 11, 72; 257/183, 197, 200, 586

[56] References Cited

U.S. PATENT DOCUMENTS 4,885,614 12/1989 Furukawa et al. .................. 257/198
5,006,912 4/1991 Smith et al. ........................ 257/200

OTHER PUBLICATIONS

"Integrated Schottky Diodes In HBT Tech.", IBM Tech. Dis. Bulletin, vol. 31, No. 5 Oct. 1988.
"N-Type Resistors In GaAs HBT Tech.", IBM Tech. Dis. Bulletin, vol. 31, No. 5, Oct. 1988.
"Self-Isolating Very High Performance HBT Struct. & Process for its realization", IBM Tech. Dis. Bulletin, vol. 32, No. 10B Mar. 1990.

*Primary Examiner*—Olik Chaudhuri
*Assistant Examiner*—Long Pham
*Attorney, Agent, or Firm*—Armstrong, Westerman, Hattori, McLeland & McNaughton

[57] ABSTRACT

A heterojunction bipolar transistor includes a tungsten layer formed on a base layer. An insulating sidewall is formed on the base layer and along a vertical wall of an emitter layer formed on the base layer. An end of the tungsten layer faces a base-emitter heterojunction through the sidewall.

8 Claims, 3 Drawing Sheets

METHOD OF PRODUCING HETEROJUNCTION BIPOLAR TRANSISTOR HAVING NARROW BAND GAP BASE TYPE

This is a division of application Ser. No. 07/704,721, filed May 20, 1991, now U.S. Pat. No. 5,198,689 which is a continuation of Ser. No. 07/442,828, filed Nov. 29, 1989, now abandoned.

BACKGROUND OF THE INVENTION

The present invention generally relates to a heterojunction bipolar transistor and a method of producing the same. More particularly, the present invention is directed to a narrow band gap base type heterojunction bipolar transistor and a method of producing the same.

Recently, heterojunction bipolar transistors of two different types have been proposed, one of which is a wide band gap emitter type heterojunction bipolar transistor, and the other of which is a narrow band gap base type heterojunction bipolar transistor. In the wide band gap emitter type of heterojunction bipolar transistor, the emitter is formed of a material having a band gap wider than that of silicon. In the narrow band gap base type of heterojunction bipolar transistor, the base is formed of a material having a band gap narrower than that of silicon, such as silicon-germanium (SiGe). The present invention is directed to the latter type. Hereinafter, a heterojunction bipolar transistor is simply referred to as an HBT for the sake of simplicity.

FIG. 1 is a cross sectional view of a conventional narrow band gap base type HBT having a SiGe base. The illustrated HBT includes an n-type silicon collector layer 1, a p-type silicon-germanium base layer 2, an n-type silicon emitter layer 3, an insulating layer 4 formed of silicon oxide ($SiO_2$), a base electrode 2B and an emitter electrode 3E. A collector electrode to be formed on the collector layer 1 is omitted for convenience' sake. The base layer 2 is grown on the collector layer 1 by a molecular beam epitaxy (MBE) process or a rapid thermal epitaxy process. Then the emitter layer 3 is grown on the base layer 2 in the same process as the base layer 2. A heterojunction is formed at an interface between the base layer 2 and the emitter layer 3. Since the base layer 2 is formed of SiGe, the band gap of the base layer 2 is narrower than that of the collector layer 1 formed of silicon, so that a high current transfer ratio ($h_{FE}$) can be obtained. Additionally, an impurity can be contained in the base layer 2 at a high concentration so that the base resistance can be reduced and higher operational speed can be obtained. In addition to the above-mentioned reasons, the fact that the n-type emitter layer 3 does not contain a different type impurity (p-type impurity) contributes to an increase of the current transfer ratio ($h_{FE}$) and makes it possible to operate at low temperatures.

In the layer structure shown in FIG. 1, the emitter layer 3 is electrically coupled to the base electrode 2B through a long length of the base layer 2. In addition, conventionally, the base layer 2 is as thin as 1000 angstroms. For these reasons, the base resistance is large, which prevents the HBT from operating at high speeds.

It is noted that Japanese Laid-Open Patent Application No. 63-138773 discloses a wide band gap emitter type HBT and teaches that the base electrode is positioned as close to the base-emitter junction as possible in order to reduce the base resistance. The proposed layer structure is effective in the wide band gap emitter type. However, there is room for improvement in reduction of base resistance. Additionally, a process of producing the proposed layer structure is complex.

SUMMARY OF THE INVENTION

Accordingly, a general object of the present invention is to provide a novel and useful HBT of the narrow band gap base type in which the aforementioned disadvantages are got rid of.

A more specific object of the present invention is to provide an HBT which has a reduced base resistance and operates at higher speeds.

The above objects of the present invention are achieved by a heterojunction bipolar transistor comprising a substrate of silicon; a collector layer of silicon formed on the silicon substrate, the collector layer; a base layer of silicon-germanium formed on the collector layer, the base layer having a first base portion and a second base portion; an emitter layer of silicon formed on the second base portion of the base layer, the emitter layer having a vertical wall, a heterojunction being formed at an interface between the second base portion of the base layer and the emitter layer; a metallic layer formed on the first base portion of the base layer; an insulating layer formed on the emitter layer, the collector layer and the metallic layer, the insulating layer having first, second and third contact holes through which the emitter layer, the collector layer and the metallic layer being partially exposed, respectively, the insulating layer having a sidewall formed on the second base portion and along the vertical wall of the emitter layer, and an end of the metallic layer facing the heterojunction through the sidewall; an emitter electrode formed on the emitter layer through the first through hole; a collector electrode formed on the collector layer through the second through hole; and a base electrode formed on the metallic layer through the third through hole.

The above-mentioned objects of the present invention are also achieved by a heterojunction bipolar transistor comprising a substrate of silicon; a collector layer of silicon formed on the silicon substrate, the collector layer; a field insulating layer partially formed on the collector layer; a base layer of silicon-germanium formed on the collector layer and the field insulating layer, the base layer having a first base portion and a second base portion; an emitter layer of silicon formed on the second base portion of the base layer, the emitter layer having a vertical wall, a heterojunction being formed at an interface between the base layer and the emitter layer; a metallic layer formed on the first base portion of the base layer; an insulating layer formed on the emitter layer, the collector layer and the metallic layer, the insulating layer having first, second and third contact holes through which the emitter layer, the collector layer and the metallic layer being partially exposed, respectively, the insulating layer having a sidewall formed on the second base portion and along the vertical wall of the emitter layer, and an end of the metallic layer facing the heterojunction through the sidewall; an emitter electrode formed on the emitter layer through the first through hole; a collector electrode formed on the collector layer through the second through hole; and a base electrode formed on the metallic layer through the third through hole.

Another object of the present invention is to provide a method of producing the above-mentioned HBT.

This object of the present invention is achieved by a method of producing a heterojunction bipolar transistor comprising the steps of growing a collector layer of silicon on a substrate of silicon; growing a base layer of silicon-germanium on the collector layer; growing an emitter layer of silicon on the base layer; mesa-etching the collector layer, the base layer and the emitter layer so that the base layer has a first base portion and a second base portion, and the emitter layer has a vertical wall; depositing a first insulating layer on the collector layer, the first base portion of the base layer and the emitter layer; selectively etching the first insulating layer by an anisotropic etching process so that a sidewall which is a part of the first insulating layer is left on the first base portion and along the vertical wall of the emitter layer; selectively growing a metallic layer on the first base portion of the base layer and the emitter layer; forming a second insulating layer on the metallic layer and the sidewall; forming a first contact hole through which the emitter layer is partially exposed, a second contact hole through which the collector layer is partially exposed, and a third contact hole through which the metallic layer is partially exposed; and forming an emitter electrode, a collector electrode and a base electrode on the emitter layer, the collector layer and the first base portion through the first, second and third contact holes, respectively.

The above-mentioned object of the present invention is also achieved by a method of producing a heterojunction bipolar transistor comprising the steps of growing a collector layer of silicon on a substrate of silicon; forming a field insulating layer on the collector layer; growing a base layer of silicon-germanium on the collector layer and the field insulating layer; growing an emitter layer of silicon on the base layer; mesa-etching the collector layer, the base layer and the emitter layer so that the base layer has a first base portion and a second base portion, and the emitter layer has a vertical wall; depositing a first insulating layer on the collector layer, the first base portion of the base layer and the emitter layer; selectively etching the first insulating layer by an anisotropic etching process so that a sidewall which is a part of the first insulating layer is left on the first base portion and along the vertical wall of the emitter layer; selectively growing a metallic layer on the first base portion of the emitter layer, the collector layer and the first base portion of the base layer; forming a second insulating layer on the metallic layer and the sidewall; forming a first contact hole through which the emitter layer is partially exposed, a second contact hole through which the collector layer is partially exposed, and a third contact hole through which the metallic layer is partially exposed; and forming an emitter electrode, a collector electrode and a base electrode on the emitter layer, the collector layer and the first base portion through the first, second and third contact holes, respectively.

Additional objects, features and advantages of the present invention will become apparent from the following detailed description when read in conjunction with the accompanying drawings.

DESCRIPTION OF THE PREFERRED EMBODIMENTS

Figure 1:
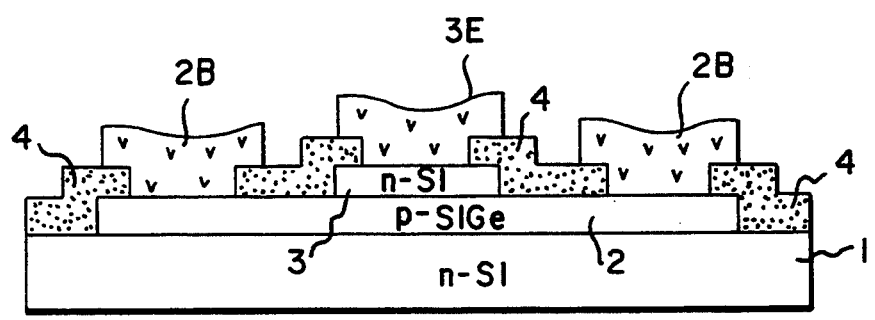
FIG. 1 is a cross sectional view of a conventional narrow band gap base type HBT.
Figure 2:
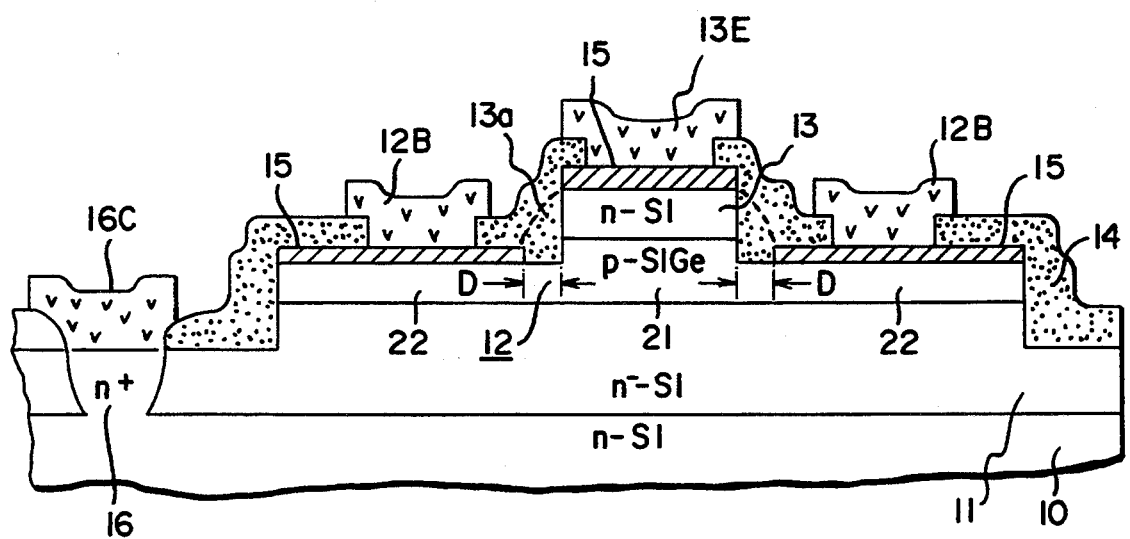
FIG. 2 is a cross sectional view of a preferred embodiment of the present invention.

A description is given of a preferred embodiment of the present invention with reference to FIG. 2. Referring to FIG. 2, an $n^-$-type silicon collector layer 11 is formed on an n-type silicon substrate 10. A p-type SiGe base layer 12 is formed on the collector layer 11. The base layer 12 has an inner base portion 21, and outer base portions 22 formed so as to surround the inner base portion 21. Tungsten (W) layers 15 are formed on the outer base portions 22 of the base layer 12. An n-type Si emitter layer 13 is formed on the inner base portion 21 of the base layer 12. There is formed a base-emitter heterojunction at an interface between the inner base portion 21 and the emitter layer 13. A tungsten layer 15 having a thickness of 1000 angstroms for example, is formed on the emitter layer 13. It is noted that edges of the tungsten layers 15 formed on the outer base portions 22 are very close to the base-emitter heterojunction. The distance D between the edge of the tungsten layer 15 and the edge of the inner base portion 21 (emitter layer 13) is 1000 angstroms for example. As will be described later, the distance D corresponds to the thickness of a sidewall layer (indicated by a broken line) formed along a vertical wall 13a of the emitter layer 13. An insulating layer 14 made of silicon oxide ($SiO_2$) is formed on the entire surface of the layer structure. An emitter electrode 13E is formed on the tungsten layer 15 on the inner base portion 22 through a contact hole formed in the insulating layer 14. Base electrodes 12B are formed on the tungsten layers 15 formed on the outer base portions 22 through contact holes formed in the insulating layer 14. A collector electrode 16C is formed on an $n^+$-type collector contact layer 16 formed in the collector layer 11.

A description is given of a method of producing the HBT shown in FIG. 2 with reference to FIGS. 3A through 3D.

Figure 3A:
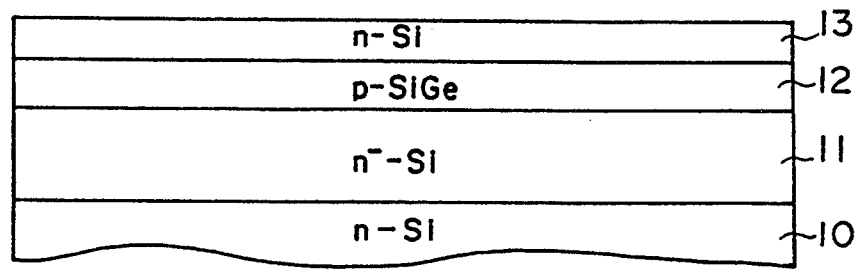
FIGS. 3A through 3D are cross sectional views taken at different steps of a method of manufacturing the HBT shown in FIG. 2.

First, as shown in FIG. 3A, the $n^-$-type silicon collector layer 11 is epitaxially grown to a thickness of 1 [μm] on the n-type silicon substrate 10 by the MBE process. Next, the p-type SiGe base layer 12 having an impurity concentration of $10^{18}$–$10^{19}$ [/cm] is epitaxially grown to a thickness of 700 angstroms on the collector layer 11 by the MBE process. Then the n-type silicon emitter 13 having an impurity concentration of $10^{19}$–$10^{21}$ [/cm] is epitaxially grown to a thickness of 1500 angstroms on the base layer 12 by the MBE process.

Figure 3B:
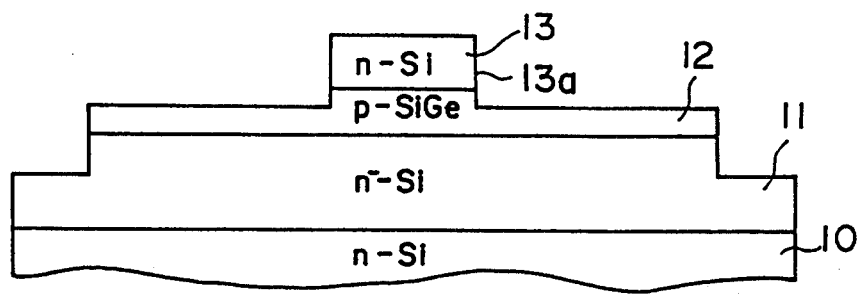

Next, as shown in FIG. 3B, using a conventional lithography technique such as a reactive ion etching (RIE) process, the base layer 12 is mesa-etched in which a chloride gas is used as a reaction gas. Thereafter, the emitter layer 13 on the base layer 12 is mesa-etched by using the lithography technique so that the vertical wall 13a is formed.

Figure 3C:
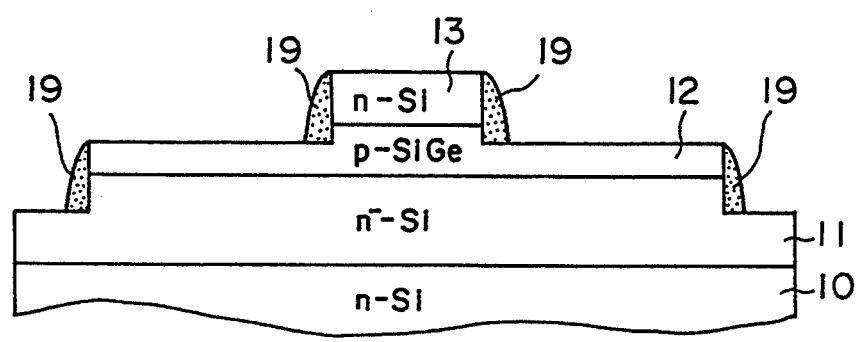

Then, referring to FIG. 3C, a silicon oxide ($SiO_2$) layer (not shown) is deposited to a thickness of 2000 angstroms by a chemical vapor deposition (CVD) process. Thereafter, the $SiO_2$ layer is selectively etched by the RIE process in which a fluoride gas is used as a reaction gas. By this process, a part of the SiO₂ layer along vertical walls formed by mesa-etching is left so that sidewalls 19 of SiO₂ are formed along the vertical walls. For example, the sidewall 19 is formed along the vertical wall 13a of the emitter layer 13.

Figure 3D:
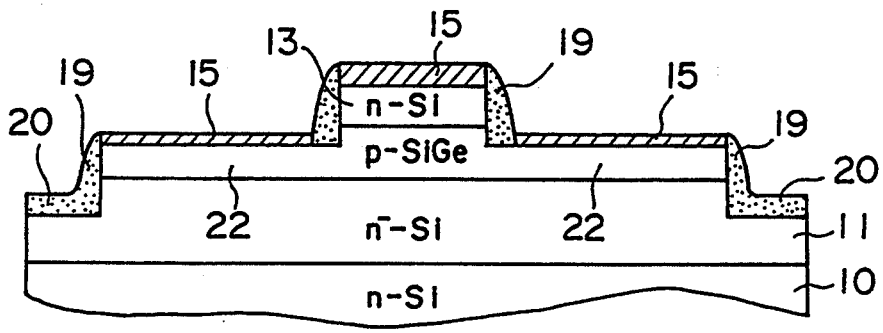

After that, as shown in FIG. 3D, an exposed surface of the collector layer 11 is coated by another SiO₂ layer 20. Then the tungsten layers 15 are selectively grown to a thickness of 500 to 2000 angstroms on the outer base portions 22 and the emitter layer 13. The growth of the tungsten layers 15 is done by a conventional selective growth process (see C. Kaanta et al., "SUBMICRON WIRING TECHNOLOGY WITH TUNGSTEN AND PLANARIZATION", IEEE, IEDM, pp. 209–211, 1987 or H. Kotani, et al., "A HIGHLY RELIABLE SELECTIVE CVD-W UTILIZING SiH₄ REDUCTION FOR VLSI CONTACTS", IEEE, IEDM, pp. 217–221, 1987). In the selective growth, tungsten is deposited only on the semiconductor layers 11 and 13 and, on the other hand, no tungsten is deposited on the SiO₂ insulating layers 19 and 20. For example, the tungsten layer 15 is deposited to a thickness of 500 to 2000 angstroms at 1 [torr] and 350 [°C.] in a reaction gas of WF₆+SiH₄.

Finally, the aforementioned SiO₂ insulating layer 14 is deposited on the entire surface (the SiO₂ insulating layer 19 is contained in the insulating layer 14), contact holes for source, drain and base are formed in the SiO₂ insulating layer 14 by the lithography technique. Then the base, emitter and collector electrodes 13E, 12B and 16C are formed.

The tungsten layers 15 present a very small resistance which is three to four digits smaller than that of silicon. In addition, edges of the tungsten layers 15 on the outer base portions 22 are very close to the emitter-base heterojunction. With this structure, it becomes possible to reduce the base resistance and increase operation speed. Moreover, the aforementioned production process for the embodiment is simple, as compared with the method proposed in the aforementioned document.

A description is given of a second preferred embodiment of the present invention with reference to FIGS. 4A through 4E.

Figure 4A:
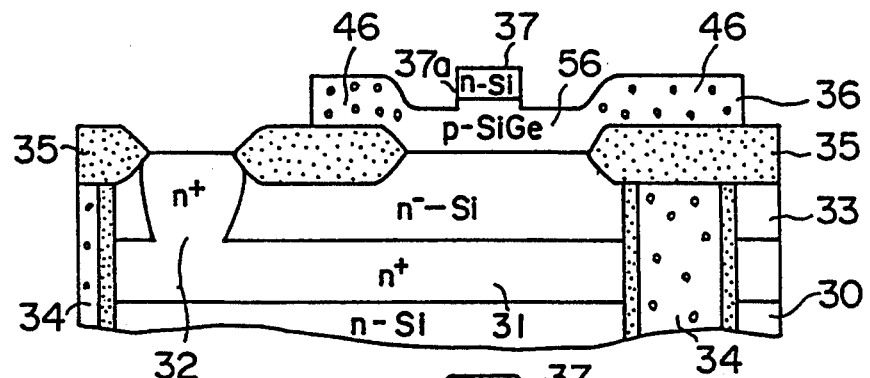
FIGS. 4A through 4E are cross sectional views taken at different steps of a method of manufacturing a second preferred embodiment of the present invention.

First, as shown in FIG. 4A, an n⁺-type burried layer 31, an n⁺-type collector contact layer 32, an n⁻-type collector layer 33, U-shaped separation trenches 34 are formed in an n-type silicon substrate 30 in a conventional process. Field insulating layers 35 are formed on the collector layer 33 in a conventional process. After that, an n⁻-type silicon collector layer 33 is epitaxially grown to a thickness of 1 [μm] on the silicon substrate 30 by the MBE process. Next, a p-type SiGe base layer 36 having an impurity concentration of $10^{18}$–$10^{19}$ [/cm] is epitaxially grown to a thickness of 700 angstroms on the collector layer 33 and the field insulating layers 35 by the MBE process. Then an n-type silicon emitter 37 having an impurity concentration of $10^{19}$–$10^{21}$ [/cm] is epitaxially grown to a thickness of 1500 angstroms on the base layer 36 by the MBE process. Thereafter, the base layer 36 is mesa-etched and the emitter layer 37 is mesa-etched so that a vertical wall 37a is formed. It is noted that since a part of the base layer 36 (outer base portions 46) is formed on the field insulating layers 35, it becomes polycrystalline silicon (polysilicon) and the remaining base layer portion (an inner base portion 56) is a single crystal silicon.

Figure 4B:
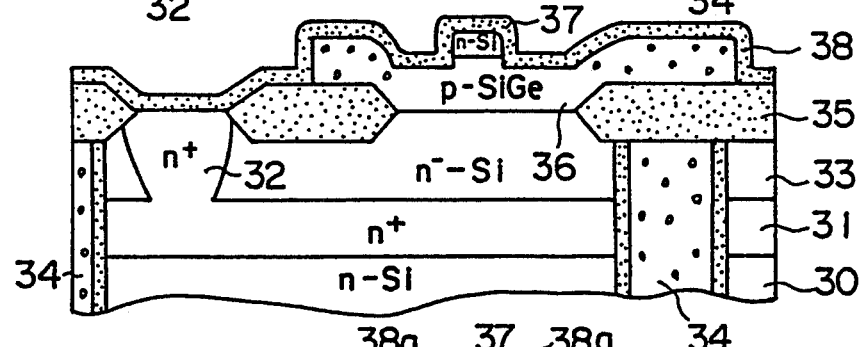

Next, as shown in FIG. 4B, a silicon oxide (SiO₂) layer 38 is deposited to a thickness of 2000 angstroms on the entire surface by the CVD process.

Figure 4C:
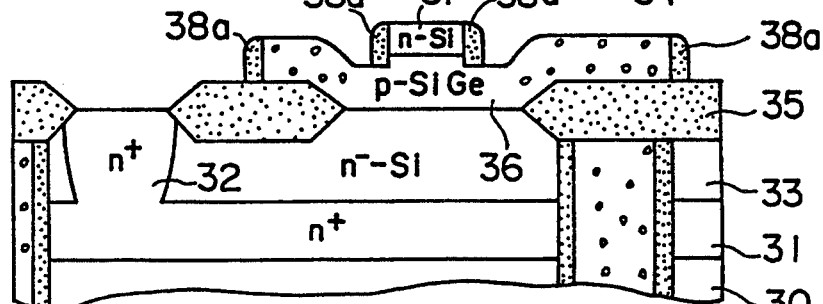

Then, as shown in FIG. 4C, the SiO₂ layer 38 is selectively etched by the RIE process so that sidewalls of SiO₂ are formed along vertical walls of the layer structure.

Figure 4D:
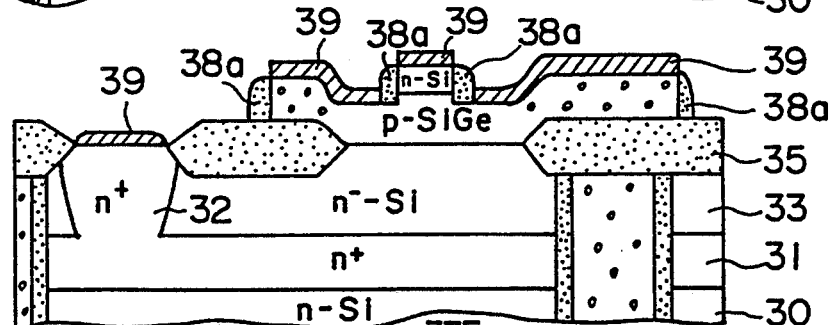
Figure 4E:
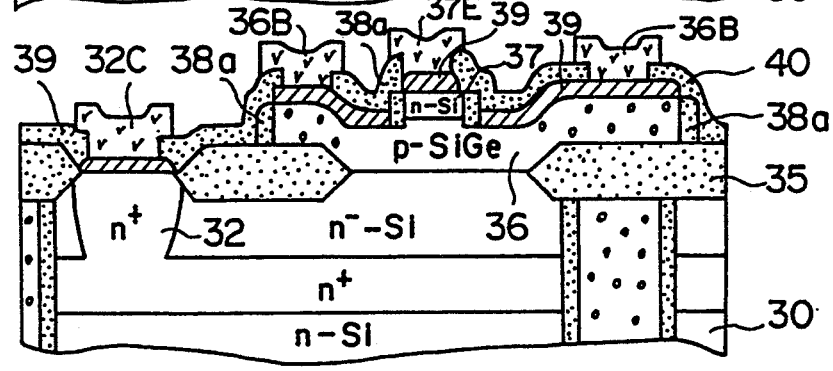

After that, as shown in FIG. 4D, tungsten layers 39 are selectively grown to a thickness of 500 angstroms on the exposed surface of the base layer 36, the emitter layer 37 and the collector contact layer 32. No tungsten is deposited on the field insulating layers 35.

Finally, a silicon oxide (SiO₂) insulating layer 40 (the aforementioned SiO₂ layer 38 is included in this layer) is deposited on the entire surface. Contact holes (windows) are formed in the insulating layer 40, and base electrodes 36B, an emitter electrode 37E and a collector electrode 32C are formed. The second embodiment thus fabricated has the same advantages as the aforementioned embodiment. Additionally, the production process for the second embodiment is simple, as compared with the conventional process proposed in the aforementioned application.

Tungsten may be replaced by another substance. It is essential that the layers 15 or 39 be selectively grown. For example, a refractory metal other than tungsten such as molybdenum (Mo) may be used. Alternatively, a refractory metal silicide such as tungsten silicide (WSi₂) or platinum silicide (PtSi₂) may be used. The following document proposes selective CVD tungsten silicide; T. Ohba, "SELECTIVE CVD TUNGSTEN SILICIDE FOR VLSI APPLICATIONS, IEEE, IEDM, pp. 213–216, 1987.

The present invention is not limited to the aforementioned embodiments, and variations and modifications may be made without departing from the scope of the present invention.

What is claimed is:

1. A method of producing a heterojunction bipolar transistor, comprising the steps of:

growing a collector layer of silicon on a substrate of silicon;

growing a base layer of silicon-germanium on said collector layer;

growing an emitter layer of silicon on said base layer;

mesa-etching said collector layer, said base layer and said emitter layer so that said base layer has a first base portion and a second base portion, and said emitter layer has a vertical wall, a heterojunction being formed at an interface between said second base portion of said base layer and said emitter layer;

depositing a first insulating layer on said collector layer, said first base portion of said base layer and said emitter layer;

selectively etching said first insulating layer by an anisotropic etching process so that a sidewall which is a part of said first insulating layer is left on said first base portion and along said vertical wall of said emitter layer;

selectively growing a metallic layer on said first base portion of said base layer and said emitter layer, an edge of said metallic layer being substantially close to said heterojunction, and said metallic layer being a member selected from the group consisting of tungsten, molybdenum, tungsten silicide and platinum silicide;

forming a second insulating layer on said metallic layer and said sidewall;

forming a first contact hole through which said emitter layer is partially exposed, a second contact hole through which said collector layer is partially exposed, and a third contact hole through which said metallic layer is partially exposed; and forming an emitter electrode, a collector electrode and a base electrode on said emitter layer, said collector layer and said first base portion through said first, second and third contact holes, respectively.

2. A method as claimed in claim 1, wherein said metallic layer comprises a refractory metal.

3. A method as claimed in claim 1, wherein said metallic layer comprises a refractory metal silicide.

4. A method as claimed in claim 1, wherein said metallic layer comprises tungsten.

5. A method of producing a heterojunction bipolar transistor, comprising the steps of:

growing a collector layer of silicon on a substrate of silicon;

forming a field insulating layer on said collector layer;

growing a base layer of silicon-germanium on said collector layer and said field insulating layer;

growing an emitter layer of silicon on said base layer;

mesa-etching said collector layer, said base layer and said emitter layer so that said base layer has a first base portion and a second base portion, and said emitter layer has a vertical wall, a heterojunction being formed at an interface between said second base portion of said base layer and said emitter layer;

depositing a first insulating layer on said collector layer, said first base portion of said base layer and said emitter layer;

selectively etching said first insulating layer by an anisotropic etching process so that a sidewall which is a part of said first insulating layer is left on said first base portion and along said vertical wall of said emitter layer;

selectively growing a metallic layer on said first base portion of said base layer of said emitter layer, said collector layer and said first base portion of said base layer, an edge of said metallic layer being substantially close to said heterojunction, and said metallic layer being a member selected from the group consisting of tungsten, molybdenum, tungsten silicide and platinum silicide;

forming a second insulating layer on said metallic layer and said sidewall;

forming a first contact hole through which said emitter layer is partially exposed, a second contact hole through which said collector layer is partially exposed, and a third contact hole through which said metallic layer is partially exposed; and forming an emitter electrode, a collector electrode and a base electrode on said emitter layer, said collector layer and said first base portion through said first, second and third contact holes, respectively.

6. A method as claimed in claim 5, wherein said metallic layer comprises a refractory metal.

7. A method as claimed in claim 5, wherein said metallic layer comprises a refractory metal silicide.

8. A method as claimed in claim 5, wherein said metallic layer comprises tungsten.

* * * * *